United States Patent
Miller

(10) Patent No.: US 6,822,529 B2
(45) Date of Patent: Nov. 23, 2004

(54) INTEGRATED CIRCUIT INTERCONNECT SYSTEM

(75) Inventor: Charles A. Miller, Fremont, CA (US)

(73) Assignee: Formfactor, Inc., Livermore, CA (US)

( * ) Notice: Subject to any disclaimer, the term of this patent is extended or adjusted under 35 U.S.C. 154(b) by 0 days.

(21) Appl. No.: 10/749,546

(22) Filed: Dec. 29, 2003

(65) Prior Publication Data

US 2004/0140860 A1 Jul. 22, 2004

Related U.S. Application Data

(63) Continuation of application No. 10/133,062, filed on Apr. 26, 2002, now Pat. No. 6,680,659, which is a continuation of application No. 09/258,185, filed on Feb. 25, 1999, now Pat. No. 6,448,865.

(51) Int. Cl.[7] ............................................. H03H 7/01
(52) U.S. Cl. ...................... 333/33; 333/247; 333/260; 257/664
(58) Field of Search .......................... 333/32, 33, 247, 333/260; 257/664, 773

(56) References Cited

U.S. PATENT DOCUMENTS 5,111,157 A * 5/1992 Komiak ..................... 330/286

FOREIGN PATENT DOCUMENTS

WO     WO98/47190    * 10/1998

* cited by examiner

*Primary Examiner*—Stephen E. Jones
(74) *Attorney, Agent, or Firm*—Fliesler Meyer

(57) ABSTRACT

In an interconnect system for providing access to a common I/O terminal for multiple circuit devices such as drivers, receivers and electrostatic protection devices implemented on an IC, each such device is provided with a separate contact pad within the IC. The contact pads are linked to one another and to the IC I/O terminal though inductive conductors such as bond wires, metalization layer traces in the IC, or legs of a forked, lithographically-defined spring contact formed on the IC. The conductor inductance isolates the capacitance of the circuit devices from one another, thereby improving characteristics of the frequency response of the interconnect system. The inductances of the conductors and various capacitances of the interconnect system are also appropriately adjusted to optimize desired interconnect system frequency response characteristics.

9 Claims, 6 Drawing Sheets

INTEGRATED CIRCUIT INTERCONNECT SYSTEM

CROSS-REFERENCE TO RELATED APPLICATIONS

Figure 1:
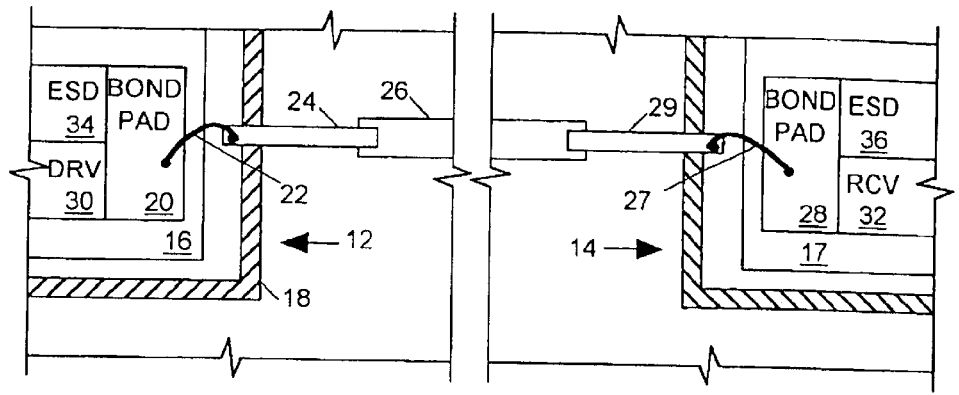

The subject matter of the present application is related to that of U.S. application FILTER STRUCTURES FOR INTEGRATED CIRCUIT INTERFACES, application Ser. No. 09/258,184, now U.S. Pat. No. 6,208,225, filed concurrently herewith.

The subject matter of the present application is also related to that of U.S. application HIGH BANDWIDTH PASSIVE INTEGRATED CIRCUIT TESTER PROBE CARD ASSEMBLY, application Ser. No. 09/258,186, now U.S. Pat. No. 6,218,910, filed concurrently herewith.

BACKGROUND OF THE INVENTION

1. Field of the Invention

The present invention relates in general to a system for interconnecting multiple devices implemented in an integrated circuit (IC) to a circuit node external to the IC, and in particular to a system employing appropriately-sized inductors and capacitors to isolate and impedance match the IC devices to enhance interconnect system frequency response.

2. Description of Related Art

In an integrated circuit (IC), each signal transmitter or receiver device that communicates with a circuit node external to the IC is typically linked to a bond pad on the surface of the IC's substrate. In a typical packaged IC a bond wire connects the bond pad to a conductive leg or pin extending from the package surrounding the IC. When the IC package is mounted on a printed circuit board (PCB), the package leg is soldered to a microstrip PCB trace on the surface of the PCB or to a via connected to a stripline conductor on another layer of the PCB. When bond pads of one or more other ICs mounted on the PCB are linked to the PCB trace in a similar manner, the bond pads, bond wires, package legs, and the PCB trace form an interconnect system for conveying signals between devices implemented in two or more ICs. Many ICs also include electrostatic discharge protection devices (ESDs) also connected to each bond pad to protect the IC from high voltage noise spikes.

In high frequency applications a combination of series inductances and shunt capacitances in the signal path provided by the interconnect system attenuate and distort signals. The bond wire and package leg typically contribute most of the series inductance. The capacitance of any IC driver, receiver and/or ESD device connected to the bond pad and the capacitance of any device connected to the PCB trace (such as for example, a via) provide most of the interconnect system capacitance. The conventional approach to reducing the amount of signal distortion and attenuation caused by the interconnect system has been to minimize the series inductance and shunt capacitance of the interconnect system. The inductance of bond wires and package legs can be minimized by keeping them as small as possible. Driver, receiver and ESD capacitances can be controlled to some extent by controlling shapes and dimensions of structures within the IC. The PCB trace impedance can be controlled by appropriately choosing physical characteristics of the trace such as its width and length, its spacing from ground planes and dielectric nature of the insulating material forming the circuit board. Vias, conductors passing vertically through a circuit board to interconnect PCB traces on various layers of the PCB, can be a source of capacitance along the PCB trace. Designers avoid the use of vias in high frequency applications in order to limit the shunt capacitance of the interconnect system. When vias are unavoidable, designers typically structure them so as to minimize their capacitance. Although minimizing the inductance of the bond wire and package leg, the capacitances of the trace, drivers, receivers and ESD devices can help increase the bandwidth, flatten frequency response and reduce the signal distortion, it is not possible to completely eliminate interconnect system inductance and capacitance. Thus some level of signal distortion and attenuation is inevitable when signal frequencies are sufficiently high.

What is needed is a way to substantially improve various characteristics of frequency response of the interconnect system beyond that which is attainable by reducing interconnect system inductances and capacitances to minimum attainable values.

SUMMARY OF THE INVENTION

An interconnect system in accordance with the invention provides a signal path between multiple devices such as drivers, receivers and electrostatic protection devices implemented on an integrated circuits (IC) and a single external circuit node such as a printed circuit board (PCB) trace.

In accordance with one aspect of the invention, each such device is connected to a separate contact on the IC. The separate contacts are interconnected to one another and to the trace by inductive conductors. The conductor inductance isolates the device capacitances from one another, thereby improving various characteristics of the frequency response of the interconnect system, for example, by increasing bandwidth and decreasing signal distortion.

In accordance with another aspect of the invention the inductive conductors are bond wires.

In accordance with a further aspect of the invention, in an alternative embodiment thereof, the inductive conductors are separate legs of a forked, lithographically-defined spring contact.

In accordance with a further aspect of the invention, in an alternative embodiment thereof, the inductive conductors include lithographically-defined traces formed on a metalization layer of the IC die.

In accordance with yet another aspect of the invention, capacitance is added to the PCB trace, suitably by an appropriately dimensioned via. The magnitude of the conductor inductances and of the added trace capacitance are appropriately adjusted to optimize characteristics of the interconnect system frequency response.

It is accordingly an object of the invention to provide a system for interconnecting integrated circuits having an improved frequency response.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
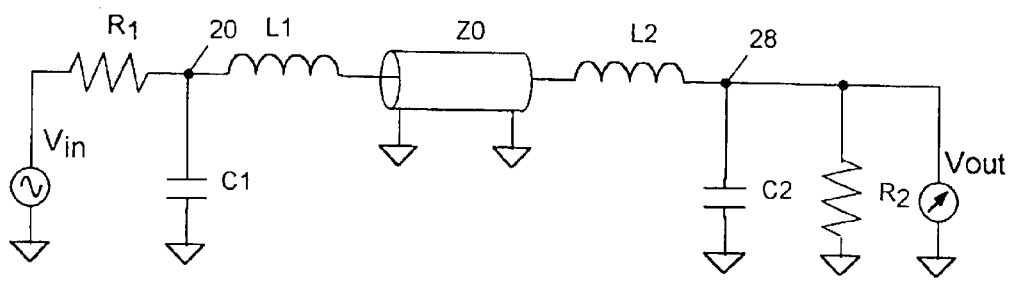
Figure 3:
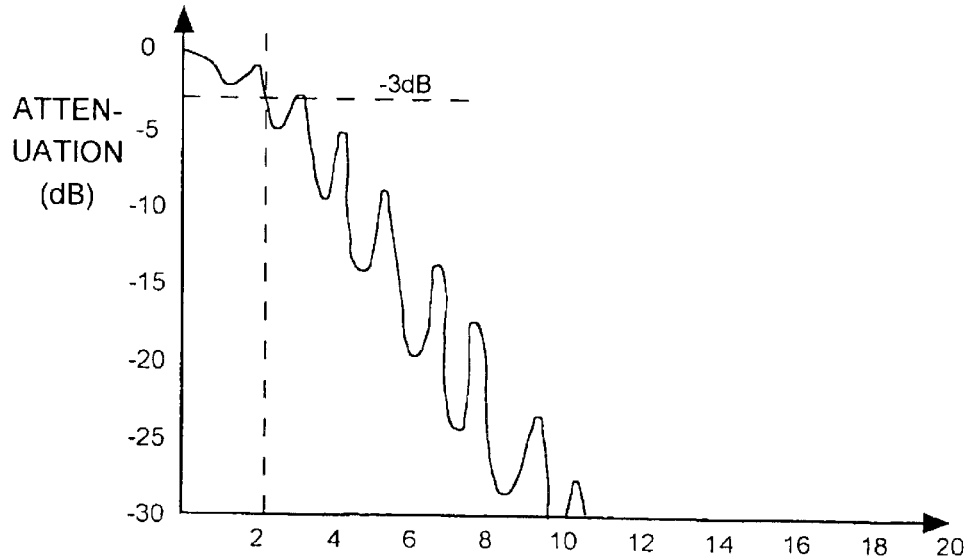
Figure 4:
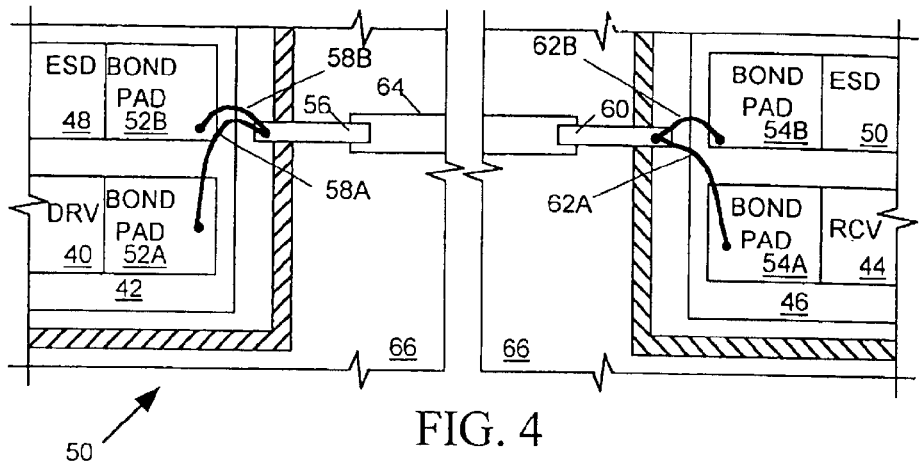
Figure 5:
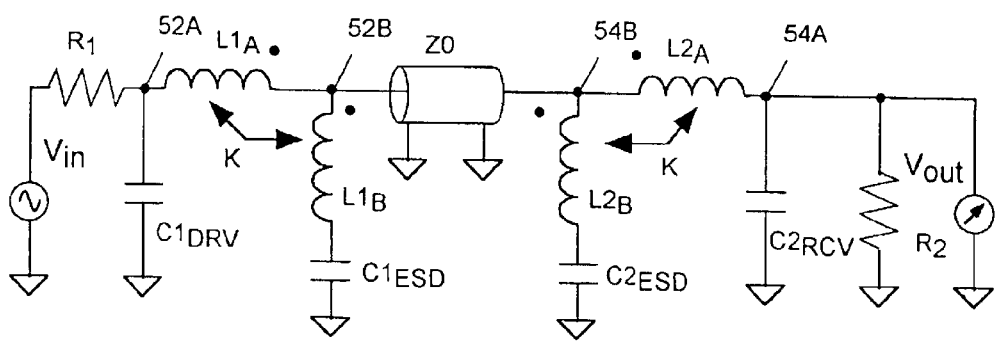
Figure 6:
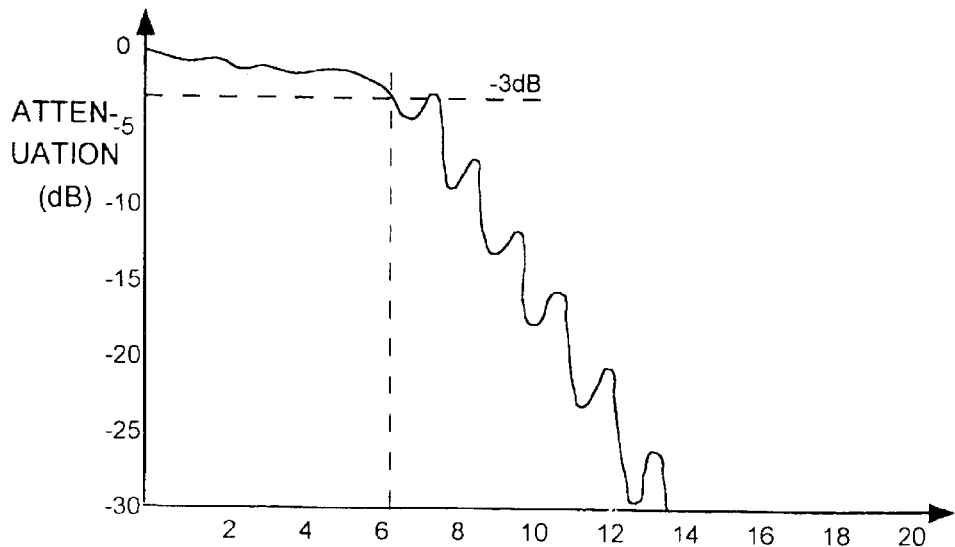
Figure 7:
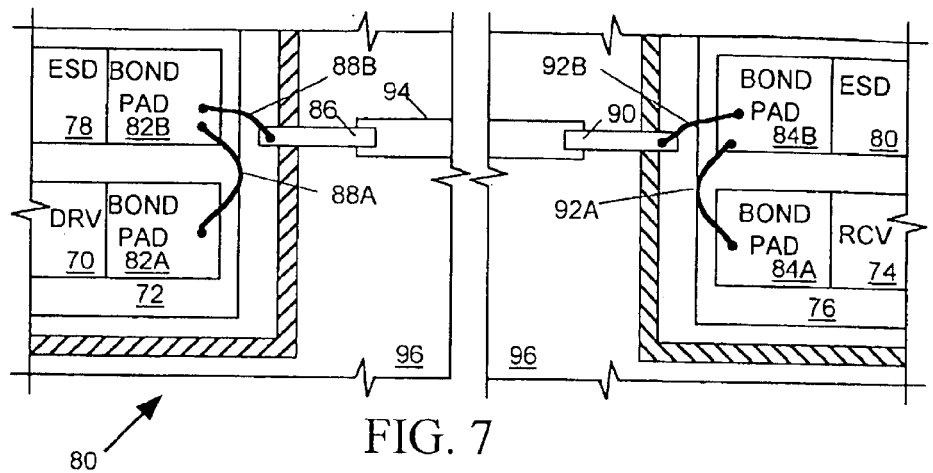
Figure 8:
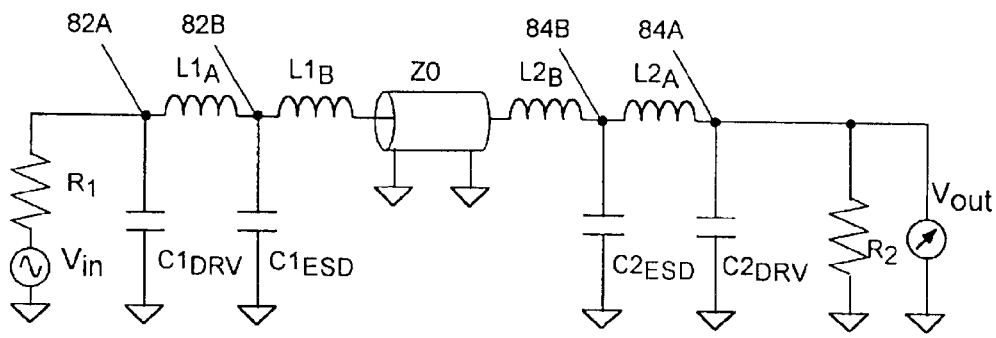
Figure 9:
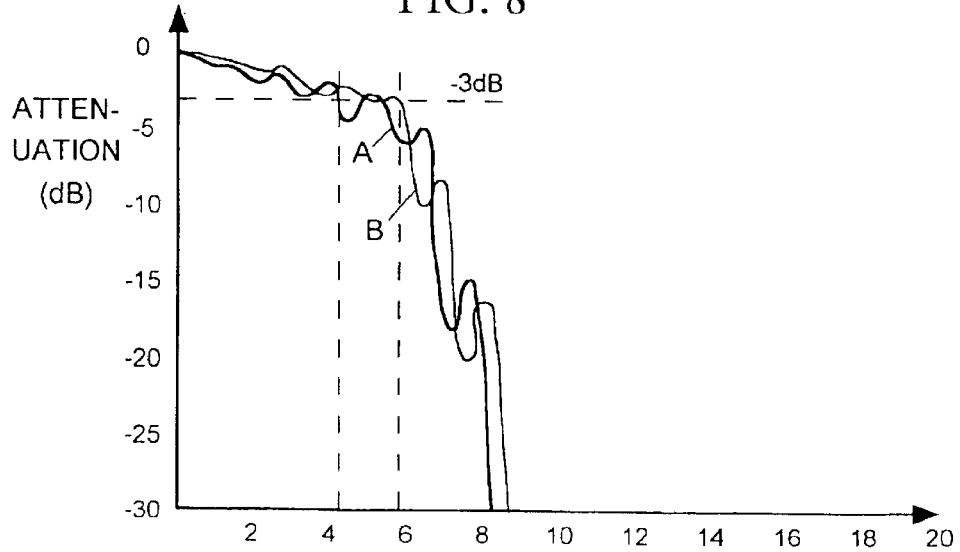
Figure 10:
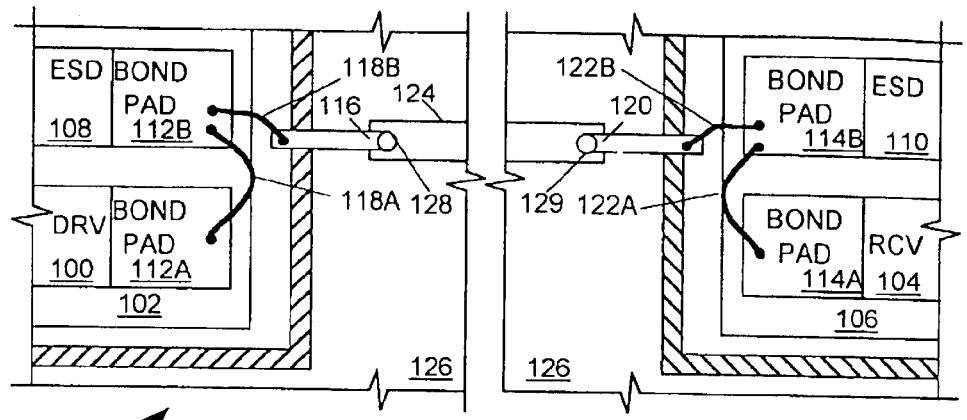
Figure 11:
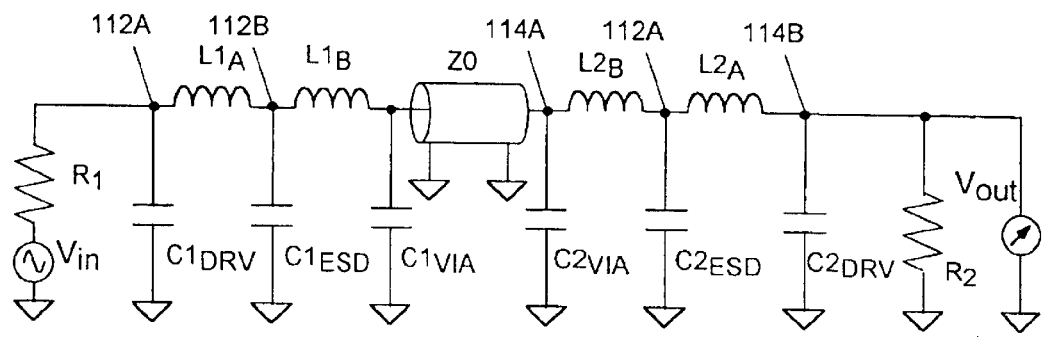
Figure 12:
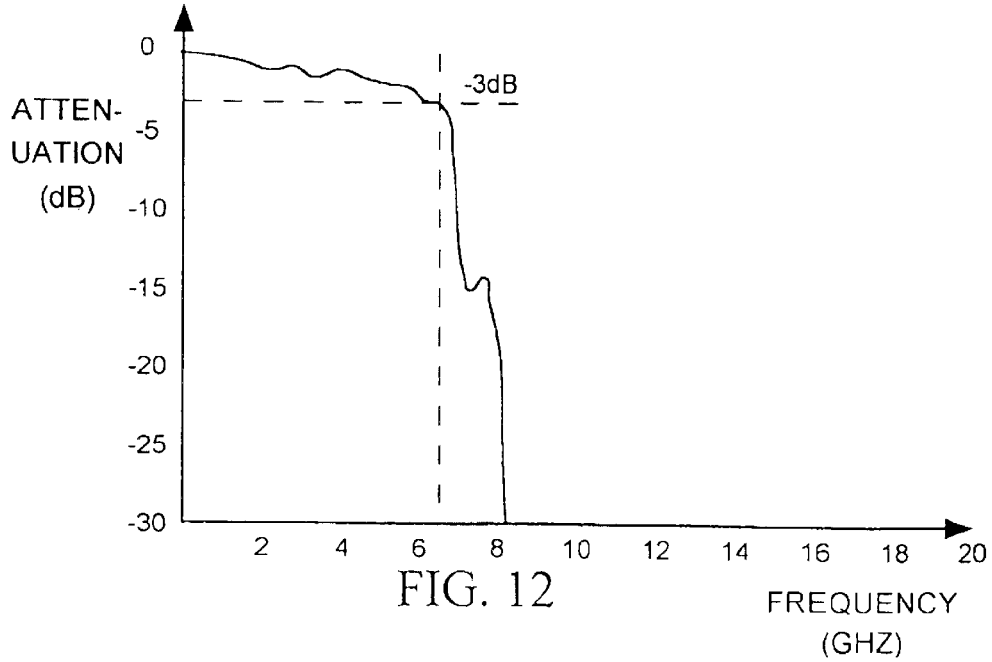
Figure 13:
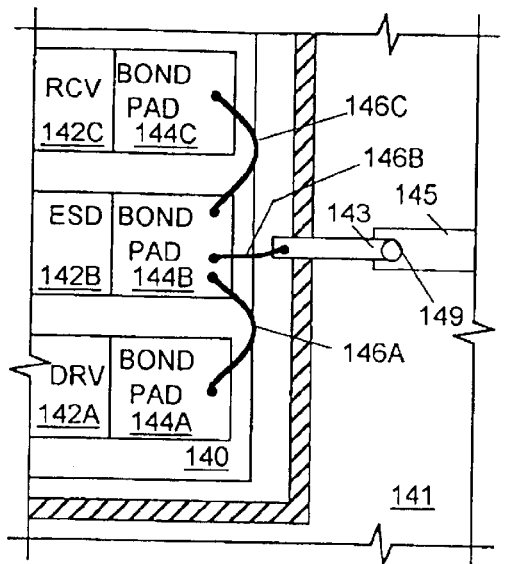
Figure 14:
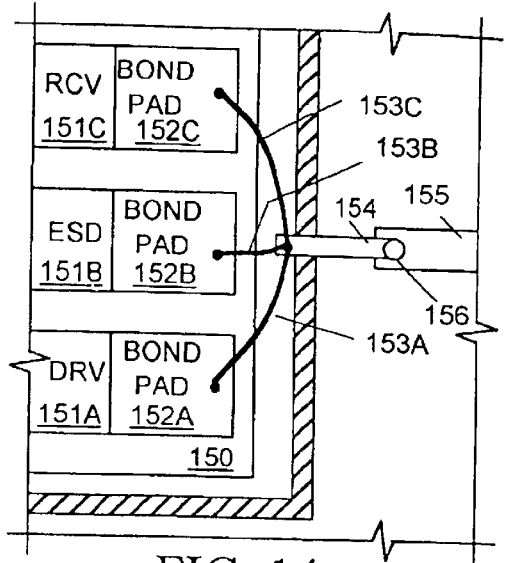
Figure 15:
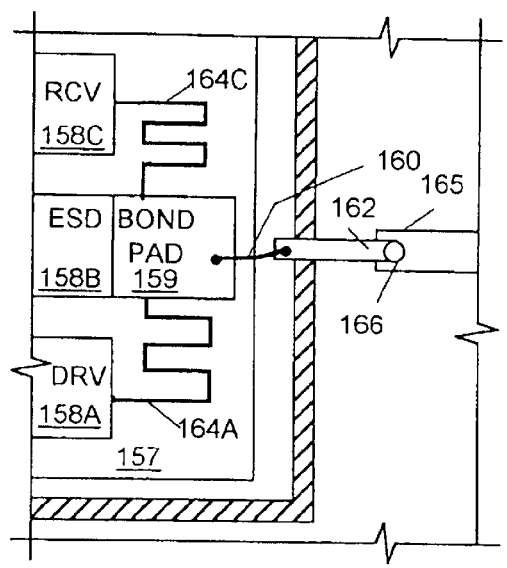
Figure 16:
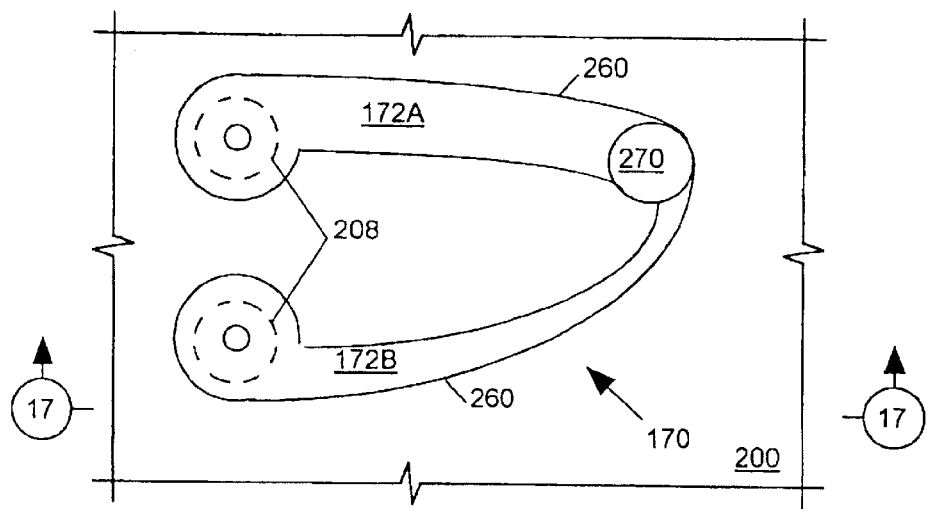
Figure 17:
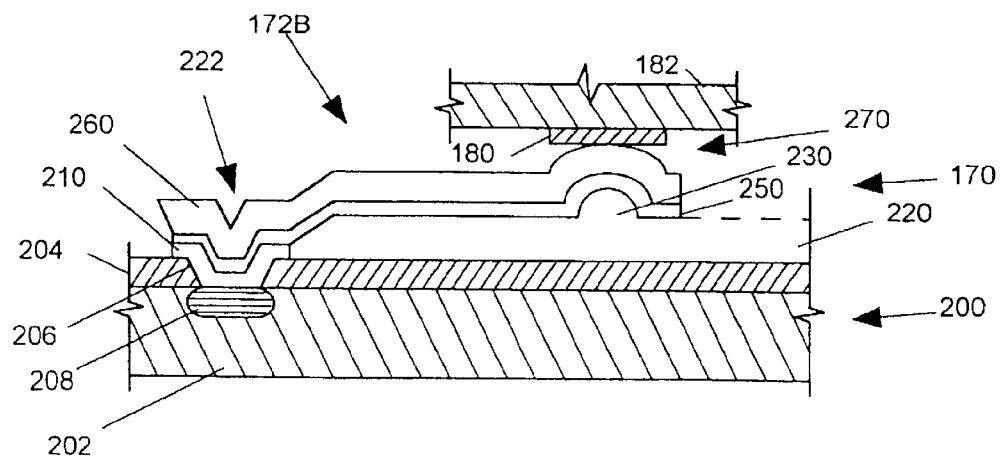

FIG. 1 is a plan view of two integrated circuits (ICs) and a prior art structure for interconnecting them, FIG. 2 is an equivalent circuit diagram modeling the electrical behavior of input/output devices of the ICs of FIG. 1 and the prior art structure interconnecting them, FIG. 3 illustrates the frequency response of the equivalent circuit of FIG. 2, FIG. 4 is a plan view of two integrated circuits (ICs) and an interconnect system for interconnecting them in accordance with the present invention, FIG. 5 is an equivalent circuit diagram modeling the electrical behavior of input/output devices of the ICs of FIG. 4 and the interconnect structure interconnecting them, FIG. 6 illustrates the frequency response characteristics of the equivalent circuit of FIG. 5, FIG. 7 is a plan view of two ICs and an interconnect system for interconnecting them in accordance with a first alternative embodiment of the present invention, FIG. 8 is an equivalent circuit diagram modeling the electrical behavior of input/output devices of the ICs of FIG. 7 and the interconnect structure interconnecting them, FIG. 9 illustrates the frequency response characteristics of the equivalent circuit of FIG. 8, FIG. 10 is a plan view of two ICs and an interconnect system for interconnecting them in accordance with the present invention, FIG. 11 is an equivalent circuit diagram modeling the electrical behavior of input/output devices of the ICs of FIG. 10 and the interconnect structure interconnecting them, FIG. 12 illustrates the frequency response characteristics of the equivalent circuit of FIG. 11, FIG. 13 is a plan view of an integrated circuit and an interconnect system in accordance with the present invention for interconnecting multiple devices implemented in the integrated circuit to a printed circuit board trace, FIG. 14 is a plan view of an integrated circuit and an interconnect system in accordance with the present invention for interconnecting multiple devices implemented in the integrated circuit to a printed circuit board trace, FIG. 15 is a plan view of an integrated circuit and an interconnect system in accordance with an alternative embodiment of the present invention for interconnecting multiple devices implemented in the integrated circuit to a printed circuit board trace, FIG. 16 is a plan view of an integrated circuit and an interconnect system in accordance with the present invention for interconnecting multiple devices implemented in the integrated circuit to a printed circuit board trace, and FIG. 17 is sectional elevation view of an integrated circuit and an interconnect system in accordance with the present invention for interconnecting multiple devices implemented in the integrated circuit to a printed circuit board trace.

DESCRIPTION OF THE PREFERRED EMBODIMENT(S)

Prior Art Interconnect System

The present invention can be considered as an improvement to a prior art interconnect system for conveying signals between integrated circuits mounted on a printed circuit board. FIG. 1 is a simplified plan view of the prior art interconnect system, including a printed circuit board (PCB) 10 upon which is mounted a pair of integrated circuit (IC) devices 12 and 14. IC device 12 includes an IC 16 contained within an IC package 18. A bond pad 20 on the surface of IC 16 acts as an input/output (I/O) terminal for signals entering or departing IC 16. A typical IC has several input/output terminals and will therefore include several bond pads. However for simplicity only one bond terminal (package leg 24) is shown in FIG. 1. A bond wire 22 links bond pad 20 to a conductive pin or leg 24 extending outward from package 18. Leg 24 is typically soldered onto a microstrip PCB trace 26 on the surface of PCB 10. When a bond pad 28 on an IC 17 within IC device 14 is connected to microstrip PCB trace 26 in a similar manner through a bond wire 27 and a package leg 29, devices connected to bond pads 20 and 28 can communicate with one another via the signal path formed by bond pads 20 and 28, bond wires 22 and 27, package legs 24 and 29, and PCB trace 26.

In the example of FIG. 1, IC 16 includes a conventional driver circuit 30 for transmitting an analog or digital signal outward via bond pad 20 while IC 17 includes a receiver circuit 32 for receiving an incoming analog or digital signal arriving at bond pad 28. ICs 16 and 17 also include conventional electrostatic discharge protection devices (ESDs) 34 and 36 connected to bond pads 20 and 28, respectively, for protecting the ICs from high voltage noise spikes.

FIG. 2 is an equivalent circuit diagram modeling devices within ICs 16 and 17 of FIG. 1 and the various structures interconnecting them. Driver 30 is modeled as an ideal signal source $V_{in}$ transmitting a signal to pad 20 through a resistance R1. The capacitance to ground at bond pad 20 is modeled as a single capacitor C1 which includes the sum of the output capacitance of driver 30 and the input capacitance of ESD 34. Bond wire 22 and package leg 24 are primarily inductive at higher signal frequencies and therefore can be modeled as a single inductor L1. Receiver 32 is modeled as an ideal signal receiver $V_{OUT}$ having input impedance R2 connected to bond pad 28. The capacitance at bond pad 28 is modeled as a single capacitor C2 that includes the sum of capacitances of ESD 36 and receiver 32. Bond wire 27 and package leg 29 are modeled as a single inductor L2. Trace 26 is modeled by its characteristic impedance Z0. Since no major source of capacitance outside of ICs 12 and 16 is connected to PCB trace 26, then assuming trace 26 is designed for low capacitance, the PCB trace capacitance is assumed to be substantially 0.

The system interconnecting driver $V_{in}$ and receiver $V_{out}$ can substantially attenuate and distort high frequency signals passing between driver 30 and receiver 32. The conventional approach to reducing the amount of signal distortion and attenuation in high frequency applications has been to minimize the series inductance and shunt capacitances in the path between $V_{in}$ and $V_{out}$. Following this approach, designers of prior art interconnect systems have avoided the use of vias on trace 26 and have carefully designed trace 26 to substantially eliminate its capacitance. Inductances L1 and L2 are typically minimized by keeping bond wires 20, 27 and package legs 24, 29 as small as possible. The capacitances C1 and C2 at bond pads 20 and 28 can be reduced to some extent by controlling various structural characteristics of IC 16 and IC 17.

Table I below illustrates typical impedance values for L1, L2, C1 and C2 for the prior art interconnect system equivalent circuit of FIG. 2. The 50 Ohm impedance values for R1, R2 and Z0 are typical in high frequency applications. The 1 nH and 2 pF capacitance values are typical of minimum practically obtainable values.

TABLE I

| ELEMENT | IMPEDANCE |
| --- | --- |
| L1 | 1 nH |
| L2 | 1 nH |
| C1 | 2 pF |
| C2 | 2 pF |
| Z0 | 50 Ohms |
| $R_1$ | 50 Ohms |
| $R_2$ | 50 Ohms |

FIG. 3 illustrates the frequency response characteristics of the prior art interconnect system of FIG. 2 when components are set to the values indicated in Table I. If we define the upper limit of the passband as the minimum frequency at which attenuation is −3 dB, then FIG. 3 shows that the prior art interconnect system of. FIGS. 1 and 2 has a 2 GHz bandwidth. Note that since the passband is not particularly flat between 0 and 2 GHz, the interconnect system will distort signals because it will attenuate some signal frequencies in the passband substantially more than others. In many applications it is desirable that the stopband (in this example, frequencies above 2 GHz) should fall off quickly so as to substantially attenuate higher frequency signal noise. However note that FIG. 3 shows the stopband has several large peaks at various resonant frequencies. The prior art interconnect system therefore may fail to sufficiently attenuate noise at those resonant frequencies.

Optimal frequency response characteristics for an interconnect system depends on the system's application. For example, when the interconnect system is to convey an analog signal with little distortion or noise, it is usually desirable that the passband be only as wide as needed to pass the highest expected frequency component of the signal. However the passband should be as flat as possible to avoid signal distortion, and the stopband should drop off quickly so as to block high frequency noise. FIG. 3 shows that the passband of prior art interconnect system of FIGS. 1 and 2 is not wide enough to accommodate signals above 2 GHz. Also the passband ripple above about 0.5 GHz may make the interconnect system unsuitable for signal frequencies above 0.5 GHz when only low levels of distortion can be tolerated. Finally, since the frequency response illustrated in FIG. 3 fails to fall off rapidly in the stop band, the prior art interconnect system may be unsuitable in any application in which it is important to severely attenuate high frequency noise.

Improved Interconnect System

FIG. 4 illustrates a PCB 50 implementing an improved interconnect system in accordance with the present invention, for interconnecting a driver 40 within an IC 42 to a receiver 44 within an IC 46. ICs 42 and 46 also include conventional electrostatic discharge protection devices (ESDs) 48 and 50 for protecting the ICs from voltage spikes. In accordance with the invention, separate bond pads 52A, 52B, 54A and 54B are provided for driver 40, ESD 48, receiver 44 and ESD 50, respectively. Bond pads 52A and 52B are connected to a package pin or leg 56 through separate bond wires 58A and 58B. Similarly, bond pads 54A and 54B are connected to a package pin or leg 60 through separate bond wires 62A and 62B. Package legs 56 and 60 are connected to a trace 64 on the surface of a printed circuit board (PCB) 66.

FIG. 5 is an equivalent circuit diagram of the interconnect system of FIG. 4. Driver 40 of FIG. 4 is represented in FIG. 5 as an ideal source $V_{in}$ connected to pad 52A through resistance R1. Receiver 44 of FIG. 4 is represented in FIG. 5 as an ideal receiver $V_{out}$ having input resistance R2 connected to pad 54A. Bond wires 58A, 58B, 62A and 62B are modeled as inductances $L1_A$, $L1_B$, $L2_A$, and $L2_B$, respectively. The parameters $K_1$ and $K_2$ are the mutual inductance factors for inductors $L1_A$ and $L1_B$ and for inductors $L2_A$ and $L2_B$. The values of $K_1$ and $K_2$ may be adjusted by adjusting the acute angle and distance between bond wires 58A and 58B or 62A and 62B. The capacitances of driver 40, ESD 48, receiver 44 and ESD 50 are represented in FIG. 5 as capacitors $C1_{DRV}$, $C1_{ESD}$, $C2_{RCV}$ and $C2_{ESD}$, respectively. Trace 64 is represented in FIG. 5 by its characteristic impedance Z0.

The equivalent circuit of FIG. 5 differs from the prior art equivalent circuit of FIG. 2. In FIG. 2 the driver and ESD capacitances $C1_{DRV}$ and $C1_{ESD}$ appear in parallel and are represented by a single capacitor C1. In FIG. 5, due to the separation of bond pads 52A and 52B and the use of separate bond wires 58A and 58B to connect them to package leg 56, the driver and ESD capacitances $C1_{DRV}$ and $C1_{ESD}$ are isolated from one another though inductances $L1_A$ and $L1_B$ of bond wires 58A and 58B. Similarly, the receiver and ESD capacitances $C2_{RCV}$ and $C2_{ESD}$ are isolated from one another though inductances $L2_A$ and $L2_B$ of bond wires 62A and 62B. As discussed below, by isolating ESD capacitances $C1_{ESD}$ and $C2_{ESD}$ from the main signal path we improve interconnect system frequency response.

Table II below compares impedance values of the prior art interconnect system of FIG. 2 (Table I) with impedance values of the improved interconnect system of FIG. 5 when selected in accordance with the present invention.

TABLE II

| PRIOR ART | | IMPROVED | |
|---|---|---|---|
| L1 | 1 nH | $L1_A$ | 2.6 nH |
|  |  | $L1_B$ | 0.6 nH |
| L2 | 1 nH | $L2_A$ | 2.6 nH |
|  |  | $L2_B$ | 0.6 nH |
| C1 | 2 pF | $C1_{DRV}$ | 0.7 pF |
|  |  | $C1_{ESD}$ | 1.3 pF |
| C2 | 2 pF | $C2_{RCV}$ | 0.7 pF |
|  |  | $C2_{ESD}$ | 1.3 pF |
| Z0 | 50 Ohms | Z0 | 50 Ohms |
| R1 | 50 Ohms | R1 | 50 Ohms |
| R2 | 50 Ohms | R2 | 50 Ohms |
|  |  | $K_1$, $K_2$ | 0.9 |

Note that in the improved interconnect system the sum of capacitances of $C1_{DRV}$ and $C1_{ESD}$ and the sum of capacitances $C2_{RCV}$ and $C2_{ESD}$ are each 2.0 pf, the value of capacitances C1 and C2 of the prior art interconnect system. Thus the capacitances of the drivers, receivers and ESD devices are the same for both prior art and improved interconnect systems in this example. Values of R1, R2 and Z0 are also the same for prior art and improved interconnect systems. Note, however, that because the interconnect system of FIG. 4 uses more and longer bond wires than the circuit of FIG. 1, the total interconnect system inductance $L1_A+L1_B+L2_A+L2_B$ (6.4 nH) of the improved interconnect system of FIG. 4 is much larger then the total inductance L1+L2 (2 nH) of the prior art interconnect system of FIG. 1. Since conventional practice holds that frequency response is improved by reducing interconnect system inductance, not by increasing it, we might expect that with all other interconnect system component values being the same, the prior art interconnect system of FIG. 1 would have a better frequency response than the "improved" interconnect system of FIG. 4. However such is not the case.

FIG. 6 illustrates the frequency response of the interconnect system of FIG. 5 in accordance with the invention. FIG. 6 shows that the bandwidth of the interconnect system of FIG. 4 is approximately 6 GHz, substantially larger than the 2 GHz bandwidth of the prior art system as illustrated in FIG. 3. This improvement in bandwidth arises because the bond wire inductances $L1_B$ and $L2_B$ isolate the ESD capacitances $C1_{ESD}$ and $C2_{ESD}$ from the main signal path. Thus when wide bandwidth is desired, it is beneficial to increase $L1_B$ and $L2_B$ to the extent possible without affecting the ability of ESDs 48 and 50 to provide adequate protection from electrostatic noise spikes. Note too that the passband (0–6 GHz) as seen in FIG. 6 is relatively flatter (has less ripple) than the passband (0–2 GHz) illustrated in FIG. 3. This means that the improved interconnect system of FIG. 4 will pass signals with much less distortion than the prior art interconnect system of FIG. 1.

Thus it is seen that the frequency response of an interconnect system is not necessarily degraded when we increase its inductance above minimum, provided that we appropriately arrange that inductance in accordance with the present invention so that it isolates capacitive elements employing the interconnect from each other.

Alternative Embodiment

FIG. 7 illustrates a PCB 80 implementing an alternative embodiment of the interconnect system in accordance with the present invention for interconnecting a driver 70 within an IC 72 to a receiver 74 within an IC 76. ICs 72 and 76 also include conventional ESDs 78 and 80 for protecting the ICs from voltage spikes. Separate bond pads 82A, 82B, 84A and 84B are provided for driver 70, ESD 78, receiver 74 and ESD 80, respectively. Bond pad 82A is connected to bond pad 82B through a bond wire 88A while bond pad 82B is connected to a package leg 86 though a bond wire 88B. Similarly, bond pad 84A is connected to bond pad 84B though a bond wire 92A while bond pad 84B is connected to a package leg 90 through a bond wire 92B. Package legs 86 and 90 are connected to a trace 94 on the surface of a printed circuit board (PCB) 96 on which ICs 72 and 76 are mounted.

FIG. 8 is an equivalent circuit diagram of the interconnect system of FIG. 7. Driver 70 of FIG. 7 is represented in FIG. 8 as an ideal source $V_{in}$ connected to pad 82A through the driver's output resistance R1. Receiver 74 of FIG. 7 is represented in FIG. 8 as an ideal receiver $V_{out}$ having input resistance R2 connected to pad 84A. Bond wires 88A, 88B, 92A and 92B and package legs 86 and 90 of FIG. 7 are modeled in FIG. 8 as inductances $L1_A$, $L1_B$, $L2_A$, and $L2_B$, respectively. This embodiment also shows that improved interconnect system performance is realized with the constraint that $$L1_A = L1_B = L2_A = L2_B$$

Since bond wires 88A and 88B are substantially perpendicular, their mutual inductance is negligibly small. The mutual inductance between bond wires 92A and 92B is also small. The capacitances of driver 70, ESD 78, receiver 74 and ESD 80 are represented in FIG. 8 as capacitors $C1_{DRV}$, $C1_{ESD}$, $C2_{RCV}$ and $C2_{ESD}$, respectively. Trace 94 is represented in FIG. 8 by its characteristic impedance Z0.

Table III below lists suitable impedance values of the interconnect system of FIG. 8.

TABLE III

| | |
|---|---|
| $L1_A$ | 1.4 nH |
| $L1_B$ | 1.4 nH |
| $L2_A$ | 1.4 nH |
| $L2_B$ | 1.4 nH |
| $C1_{DRV}$ | 0.7 pF |
| $C2_{ESD}$ | 1.3 pF |
| $C2_{RCV}$ | 0.7 pF |
| $C2_{ESD}$ | 1.3 pF |
| Z0 | 50 Ohms |
| R1 | 50 Ohms |
| R2 | 50 Ohms |

Note that all component values are similar to those used when determining the frequency response (FIG. 6) of the interconnect system of FIG. 4 (see Table II, "Improved" column) except for differences in bond wire inductances $L1_A$, $L1_B$, $L2_A$ and $L2_B$ and lack of mutual inductance K arising from the difference in bond wire layout.

FIG. 9 illustrates the frequency response (plot A) of the interconnect system of FIG. 8 wherein the values of various components are set in accordance with Table III. Plot A of FIG. 9 shows that the bandwidth of the interconnect system of FIG. 7 is approximately 4 GHz, smaller than the 6 Ghz bandwidth of the interconnect system of FIG. 3, but still substantially larger than the 2 GHz bandwidth of the prior art system as illustrated in FIG. 3. The bandwidth of the interconnect system of FIG. 7 is not as wide as that of the system of FIG. 4 primarily because inductors $L1_B$ and $L2_B$ are series inductances whereas in the system of FIG. 7 they are shunt inductances. Note that even though the total series inductance in the improved system of FIG. 7 (5.02 nH) substantially larger than the total series inductance (2 nH) in the prior interconnect system of FIG. 1, the system of FIG. 7 has approximately twice the bandwidth.

While the bandwidth (4 GHz) of the interconnect system of FIG. 7 is smaller than the 6 GHz bandwidth of the system of FIG. 4, the interconnect system of FIG. 4 may be preferable in applications where the wider bandwidth is not needed because the frequency response of the system of FIG. 4 has sharper roll off and no major spikes in the stopband above 4 GHz. This means that the system of FIG. 7 will do a better job of blocking high frequency noise than the system of FIG. 4.

Adjusting Inductance

The frequency response of the circuits of FIGS. 4 and 7 can be further improved by appropriately adjusting the bond wire inductance, for example, by adjusting their lengths and widths and by adjusting the angle between adjacent bond wires so as to affect their mutual inductance. Table IV below compares impedance values for the interconnect circuit of FIG. 8 used when computing frequency response plot A of FIG. 9 (Table III) to impedance values for the circuit of FIG. 8 used when computing another frequency response plot (Plot B) of FIG. 8.

TABLE IV

| | PLOT A | PLOT B |
|---|---|---|
| $L1_A$ | 1.4 nH | 1.50 nH |
| $L1_B$ | 1.4 nH | 0.65 nH |
| $L2_A$ | 1.4 nH | 1.50 nH |
| $L2_B$ | 1.4 nH | 0.65 nH |
| $C1_{DRV}$ | 0.7 pF | 0.7 pF |
| $C1_{ESD}$ | 1.3 pF | 1.3 pF |
| $C2_{RCV}$ | 0.7 pF | 0.7 pF |
| $C2_{ESD}$ | 1.3 pF | 1.3 pF |
| Z0 | 50 Ohms | 50 Ohms |
| R1 | 50 Ohms | 50 Ohms |
| R2 | 50 Ohms | 50 Ohms |

Note that except for differences in bond wire inductances, the component values used to compute frequency response B are similar to the value used when determining frequency response A. Note that frequency response B has a bandwidth of about 6 GHz instead of 4 GHz. Thus while interconnect system frequency response can be improved by adding and appropriately arranging inductance to the interconnect system, frequency response may be further improved by appropriately sizing that inductance.

Adding and Adjusting Capacitance

As previously mentioned, the conventional approach to reducing the amount of signal distortion and attenuation caused by the interconnect system has been to minimize the inductance of the interconnect system. Since it is not possible to completely eliminate interconnect system inductance, an unacceptable level of signal distortion and attenuation is inevitable when signal frequencies are sufficiently high. However as discussed above, further improvements in interconnect system frequency response can be had by actually increasing system inductance and appropriately arranging it. The same considerations apply to interconnect system capacitance. Conventional wisdom holds that interconnect system frequency response is improved by minimizing system capacitance to its lowest practically attainable level. However while most values of additional PCB capacitance do degrade the frequency response of the interconnect system, appropriately adjusted higher values of PCB capacitance can substantially improve various characteristics of system frequency response.

FIG. 10 illustrates a PCB 110 implementing another alternative embodiment of the interconnect system in accordance with the present invention for interconnecting a driver 100 within an IC 102 to a receiver 104 within an IC 106. ICs 102 and 106 also include conventional ESDs 108 and 110. Separate bond pads 112A, 112B, 114A and 114B are provided for driver 100, ESD 108, receiver 104 and ESD 110, respectively. Bond pad 112A is connected to bond pad 112B through a bond wire 118A while bond pad 112B is connected to a package leg 116 though a bond wire 122B. Similarly, bond pad 114A is connected to bond pad 114B though a bond wire 122A while bond pad 114B is connected to a package leg 120 through a bond wire 122B. Package legs 116 and 120 are connected to a trace 124 on the surface of a PCB 126 on which ICs 72 and 76 are mounted. The interconnect system of FIG. 10 is therefore structurally similar to the interconnect system of FIG. 7 except that in the system of FIG. 10 a pair of vias 128 and 129 of appropriately sized capacitance are added to trace 124. Via 128 is attached to trace 124 near the point of attachment between package leg 116 and trace 124 while via 129 is attached to trace 124 near the point of attachment between package leg 120 and trace 124.

A "via" is a conductive path that passes vertically through PCB 110 and is normally employed to interconnect a trace such as trace 124 with a trace on some other layer of PCB 126. While vias conveniently distribute signals to various layers of a PCB, conventional wisdom holds that vias should be avoided in high frequency applications because their capacitance can degrade frequency response. Notwithstanding conventional wisdom, vias 128 and 129 are added precisely because the additional capacitance they provide at trace 124, when appropriately adjusted, improves system frequency response. The additional PCB capacitance provided by via 128 and 129 could also be obtained by connecting discrete capacitors or other capacitive elements to trace 124. However most PCB manufacturers can easily add vias to a PCB and can easily adjust their capacitance by adjusting their dimensions. Thus vias 128 and 129 are a convenient way to obtain the necessary additional PCB capacitance needed to improve system frequency response and have the added benefit of allowing more flexibility in signal routing. As a side benefit, vias 128 and 129 could be used to route signals from trace 124 to other PCB layers, but they need not be used for that purpose.

FIG. 11 is an equivalent circuit diagram of the interconnect system of FIG. 10. Driver 100 of FIG. 10 is represented in FIG. 11 as an ideal source $V_{in}$ connected to pad 112A through the driver's output resistance R1. Receiver 104 of FIG. 10 is represented in FIG. 11 as an ideal receiver $V_{out}$ having input resistance R2 connected to pad 114B. Bond wires 118A, 118B, 122A and 122B and package legs 116 and 120 of FIG. 10 are modeled in FIG. 11 as inductances $L1_A$, $L1_B$, $L2_A$, and $L2_B$, respectively. The capacitances of driver 100, ESD 108, receiver 104 and ESD 110 are represented in FIG. 11 as capacitors $C1_{DRV}$, $C1_{ESD}$, $C2_{RCV}$ and $C2_{ESD}$, respectively. The capacitance of vias 128 and 129 is represented by capacitors $C1_{VIA}$ and $C2_{VIA}$, respectively. Trace 124 is represented in FIG. 11 by its characteristic impedance Z0.

Table V below lists suitable component values for the interconnect system of FIG. 11

TABLE V

| | |
|---|---|
| $L1_A$ | 1.4 nH |
| $L1_B$ | 1.4 nH |
| $L2_A$ | 1.4 nH |
| $L2_B$ | 1.4 nH |
| $C1_{DRV}$ | 0.7 pF |
| $C1_{ESD}$ | 1.3 pF |
| $C1_{VIA}$ | 0.7 pF |
| $C2_{RCV}$ | 0.7 pF |
| $C2_{ESD}$ | 1.3 pF |
| $C2_{VIA}$ | 0.7 pF |
| Z0 | 50 Ohms |
| R1 | 50 Ohms |
| R2 | 50 Ohms |

FIG. 12 illustrates the frequency response of the interconnect system of FIG. 8 using the Table V values of various components.

Comparing these values to the values listed in Table IV we note that all component values are similar to those used when determining the frequency response (plot A, FIG. 9) of the interconnect system of FIG. 7 except for the added via capacitance $C1_{VIA}$ and $C2_{VIA}$. Comparing plot A of FIG. 9 to FIG. 12 we see that the added via capacitance increases the bandwidth of the interconnect system from 4 GHz to approximately 6 GHz, substantially larger than the 4 GHz bandwidth (plot A, FIG. 9) of the interconnect system of FIG. 7. Note also that the passband in FIG. 12 (0–6 GHz) is flatter (has less ripple) than the passband of plots A or B of FIG. 9, and that the stopband drops off more quickly. Thus despite the conventional wisdom that adding capacitance to an interconnect system will degrade its frequency response, a comparison of FIG. 9 and FIG. 12 shows us that increasing the capacitance of the PCB trace as illustrated in FIG. 10 will actually allow an interconnect system to pass higher frequency signals and with less distortion, provided that the additional PCB capacitance is appropriately sized.

Butterworth and Chebyshev Filters

It should be understood that the "optimal" frequency response of an interconnect system is application-dependent. For example in some applications we may want to maximize bandwidth. In other applications we may be willing, for example, to accept a narrower bandwidth in exchange for a flatter passband, less attenuation at lower frequencies, or steeper roll off in the stopband. Since the frequency response of the interconnect system depends on the impedance of its component values, the appropriate values to which the bond wire inductances $L1_A$, $L1_B$, $L2_A$ and $L2_B$ and any added PCB via capacitance $C1_{VIA}$ and $C2_{VIA}$ should adjusted are application dependent.

We can view the equivalent circuit of the interconnect system illustrated in FIGS. 5, 8 and 11, as a 4-pole or 5-pole filter. By appropriately adjusting bond wire inductance and/or via capacitance, the interconnect system can be made to behave like a well-known, multi-pole "Butterworth" filter which provides a maximally flat frequency response or like a well-known multi-pole Chebyshev filter which can optimize a combination of bandwidth and roll off characteristics. The design of multi-pole Butterworth and Chebyshev filters, including appropriate choices for component values so as to optimize various characteristics of a filter's frequency response, is well-known to those skilled in the art. See for example, pages 59–68 of the book *Introduction to Radio Frequency Design* by W. H. Hayward, published 1982 by Prentice-Hall, Inc., and incorporated herein by reference.

Multiple Drivers and Receivers

In many ICs more than one signal driver and/or receiver may access a single IC input/output pin or package leg. In such case, in accordance with the invention, the various drivers, receivers and ESD devices are provided with separate bond pads interconnected by bond wires or other conductors having appropriately sized inductance.

FIG. 13 illustrates, for example, an IC 140 mounted on a PCB 141. IC 140 includes a driver 142A, a receiver 142B and an ESD device 142C, all of which access a common package leg 143 connected to a PCB trace 145 connected to a circuit node external to IC 140, such as, for example, a terminal of another integrated circuit (not shown). In accordance with the invention, each circuit device 142A–142C is linked to a separate one of a set of bond pads 144A–144C. A bond wire 146A connects driver bond pad 144A to ESD bond pad 144B, while a bond wire 146C connects receiver bond pad 144C to ESD bond pad 144B. Bond wire 146B connects bond pad 144B to package leg 143. When a via 149 is added to trace 145, the capacitance of via 149 and the inductances of bond wires 146A–146C may be adjusted to substantially optimize desired characteristics of the interconnect system frequency response.

FIG. 14 illustrates an alternative version of the interconnect system of FIG. 13 in which three conductive contacts (bond pads) 152A–152C within an IC 150, each linked to a separate one of driver, ESD and receiver devices 151A–151C. Bond pads 152A–152C are each also connected directly to an IC package leg 154 through a corresponding one of a set of three conductors (bond wires) 153A–153C. Package leg 154 is connected to a trace 155 to form a conductive path for conveying signals to or from a circuit node external to IC 150. A via 156 (or other capacitive element) may also be connected to trace 155, with the inductance of bond wires 152A–152C and the capacitance of via 156 sized to substantially optimize desired frequency response characteristics of the interconnect system.

Inductive Isolation By Metalization Layer Traces

FIG. 15 illustrates an alternative embodiment of the invention in which bond pads 144A and 144C and bond wires 146A and 146B of FIG. 14 are replaced by a pair of lithographically-defined inductive traces 164A and 166B formed on a metalization layer of IC 140. Referring to FIG. 15, an ESD device 158B is directly connected to a bond pad 159. A bond wire 160 connects bond pad 159 to a package leg 162. A driver 158A implemented on IC 140 is linked to bond pad 159 through inductive trace 164A while a receiver 158C is linked to bond pad 159 though another inductive trace 164C. The inductance of metalization layer traces such as traces 164A and 164C can be accurately adjusted by adjusting their lengths and shapes in a well-known manner. Such metalization layer traces are often shaped in the form of spirals and are known as "spiral inductors".

Unpackaged Die Instruments

FIGS. 4, 7, 10, 13, 14 and 15 illustrate the interconnect system in accordance with the invention when used in connection with packaged ICs. In some applications, unpackaged IC dies can be directly connected through the bond wires to external traces. Thus, for example, in FIG. 4, package leg 56 could be omitted and bond wires 58A and 58B could be directly connected to trace 64.

In FIG. 13, package leg 143 could be omitted and bond wire 146B could be directly linked to trace 145.

In FIG. 14, leg 154 could be omitted and all bond wires 153A–153C could be connected directly to trace 155.

Inductive Isolation by Lithographically-Defined Spring Contacts

FIGS. 16 and 17 illustrate an alternative embodiment of the invention in which the function of bond wires and package legs of FIG. 4 is carried out by a forked, lithographically-defined spring contact 170. Spring contact 170 has two legs 172A and 172B, each providing a separate signal path from an external circuit node such as a trace 180 on a printed circuit board 168 through a tip 270 to each device (e.g. driver, receiver or ESD device) implemented in an IC 200. Contact force between tip 270 and trace 186 can be maintained by the resilience of the spring contact when IC 200 is held close to trace 180. Tip 270 may also be soldered to trace 180 when a permanent connection is desired.

In the example of FIGS. 16 and 17 spring contact 170 has two legs 172A and 172B to provide separate signal paths to two separate circuits within IC 200. However in alternative embodiments of the invention in which three or more devices must communicate with trace 180, spring contact 170 may have three or more legs. The capacitance isolating effect of the separate inductance of each leg 172A and 172B improves interconnect system frequency response in the same way that the inductance $L1_A$ and $L1_B$ of bond wires 58A and 58B of FIG. 4 improves frequency response. Since the length and width of legs 172A and 172B influences their inductance, their inductance can be independently controlled by independently adjusting their lengths and widths. In the example of FIG. 4, leg 172A is shorter and wider than leg 172B and therefore has a different inductance.

One advantage (among others) of the using the forked spring contact 170 is that since legs 172A and 172B are accurately shaped by lithographic processes, and since their shape and the angle between them control their inductance and mutual inductance, such inductance and mutual inductance can be controlled with a high degree of resolution. Thus desired characteristics of the frequency response of the interconnect system, such as passband width or flatness, can be accurately controlled. Though not shown in FIG. 17, a via or other capacitive element may be included in circuit board 182 in contact with trace 180 at or near its point of contact with the tip of spring contact 170. With the capacitance of the via or other capacitive element appropriately adjusted, we can further improve such interconnect system frequency response characteristics. The tip 270 of spring contact 170 is also suitable for directly contacting vias or for contacting circuit nodes other than PCB traces such as, for example, a bonding pad on another integrated circuit or the tip of a spring contact of another IC.

Spring contact 170 is constructed from layers of materials alternately deposited on the surface of IC 200, with dimensions of each layer being defined via conventional lithographic processes. IC 200 includes a silicon substrate 202 and an insulating passivation layer (e.g., polyimide) 204 disposed on the surface of substrate 202. Passivation layer 204 includes an opening 206 immediately above a contact pad 208. A conductive layer 210 (e.g., titanium-tungsten) is deposited on the surface of passivation layer 204, the sidewalls of opening above contact pad 208 making electrical contact with contact pad 208. A layer of masking material (e.g., photoresist) 220 is then deposited onto layer 210 and patterned by conventional photolithographic techniques to include an opening above contact pad 208 extending through masking layer 220 to conductive layer 210. Layer 220 also includes a bump 230 forming a base for the spring contact's tip 270. A conductive seed layer 250 (e.g., gold) is then deposited over masking layer 220 and lithographically etched to form the basic shape of contact 170 as viewed in FIG. 16. A resilient, conductive contact layer 260 (e.g., nickel) is then plated onto seed layer 250. The photoresist masking layer 220 is then removed with a solvent (e.g., acetone), and other remaining layers (e.g. part of layer 210) are removed using suitable techniques. In the completed spring contact 170, tip 270 has freedom to flex vertically when pressed against trace 180. PCT publication WO 98/52224A1 published Nov. 19, 1998 describes spring contact fabrication in detail and is incorporated herein by reference.

Laser Trimming

In high precision applications, the inductance of either leg 172A or 172B can be adjusted after the IC has been fabricated and tested by employing a laser beam to trim away a portion of the conductive material forming the leg. The frequency response of the interconnect system can be iteratively measured and adjusting using such laser trimming to adjust the inductance of the spring contract legs. Laser trimming techniques may also be employed to finely adjust the inductances of traces 164A and 164C of FIG. 15 as well as the capacitances of bonding pads and vias.

Thus has been shown and described alternative embodiments of an interconnect system for providing access to a common I/O terminal for multiple circuit devices such as drivers, receivers and electrostatic protection devices implemented on an IC. Each such device is provided with a separate contact pad within the IC and the contact pads are linked to one another and to the IC I/O terminal though inductive conductors such as bond wires or legs of a lithographically-defined spring contact. The conductor inductance isolates the capacitance of the circuit devices from one another, thereby improving characteristics of the frequency response of the interconnect system. In accordance with the invention, the inductances of the conductors and various capacitances of the interconnect system are also appropriately adjusted to optimize interconnect system frequency response characteristics.

While the forgoing specification has described preferred embodiment(s) of the present invention, one skilled in the art may make many modifications to the preferred embodiment without departing from the invention in its broader aspects. For example, the interconnect system of the present invention interconnects circuits formed by discrete components not implemented in ICs. The appended claims therefore are intended to cover all such modifications as fall within the true scope and spirit of the invention.

What is claimed is:

1. A method of manufacturing an interconnect system for conveying a signal between a communication circuit implemented within an integrated circuit and an external node outside the integrated circuit, the method comprising the steps of:
   a. forming an electrostatic discharge (ESD) protection device comprising capacitive impedance within the integrated circuit;
   b. producing a first conductive path comprising inductive impedance extending from the ESD protection device to the external node;
   c. providing a second conductive path comprising inductive impedance extending from the communication circuit to the external node;
   d. selecting a characteristic of a frequency response of the interconnect system from the communication device to the external node;
   e. evaluating a function of the impedances of the first and second conductive paths, the ESD protection device, and the communication circuit to calculate a magnitude of a capacitance at the external node which will substantially optimize the frequency response characteristic selected at step d; and
   f. adjusting the capacitance at the external node to approximate the magnitude calculated at step e.

2. The method in accordance with the claim 1 wherein the function models the interconnect system as a filter formed by interconnected impedances comprising the impedances of the first and second conductive paths, the ESD protection device and the communication circuit and the capacitance at the external node.

3. The method in accordance with claim 2 wherein the frequency response characteristic selected at step d is optimized when the magnitude of the capacitance at the external node causes the interconnect system to operate as a Butterworth filter.

4. The method in accordance with claim 2 wherein the frequency response characteristic selected at step d is optimized when the magnitude of the capacitance at the external node causes the interconnect system to operate as a Chebyshev filter.

5. The method in accordance with claim 1 wherein the frequency characteristic selected at step d comprises a bandwidth of the interconnect system and is optimized when maximized.

6. The method in accordance with claim 1 wherein the frequency characteristic selected at step d comprises a combination of bandwidth and roll-off of the interconnect system.

7. The method in accordance with claim 1
   wherein the first conductive path comprises a first bond wire extending from the ESD protection device to the external node; and
   wherein the second conductive path comprises a second bond wire extending from the communication circuit to the external node.

8. The method in accordance with claim 1
   wherein the first and second conductive paths are implemented by a conductive spring contact comprising:
   a tip contacting the external node,
   a first conductive leg extending from the ESD protection device to the tip, and
   a second conductive leg connected from the communication circuit to the tip.

9. The method in accordance with claim 1
   wherein the external node comprises a trace on a printed circuit board, and
   wherein the capacitance at the external node is adjusted at step f by forming a via in the printed circuit board, the via being connected to the trace and adding capacitance to the external node such that a total capacitance at the external node approximates the magnitude calculated at step e.

* * * * *